US011205697B2

(12) United States Patent
Chu et al.

(10) Patent No.: US 11,205,697 B2
(45) Date of Patent: Dec. 21, 2021

(54) SHALLOW TRENCH ISOLATING STRUCTURE AND SEMICONDUCTOR DEVICE

(71) Applicant: Fujian Jinhua Integrated Circuit Co Ltd, Quanzhou (CN)

(72) Inventors: Hsienshih Chu, Quanzhou (CN);
Dehao Huang, Quanzhou (CN);
Yunfan Chou, Quanzhou (CN);
Yaoguang Xu, Quanzhou (CN);
Yucheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/874,694

(22) Filed: May 15, 2020

(65) Prior Publication Data

US 2021/0050414 A1    Feb. 18, 2021

(30) Foreign Application Priority Data

Aug. 15, 2019  (CN) .......................... 201910751649.X

(51) Int. Cl.
*H01L 29/00* (2006.01)
*H01L 29/06* (2006.01)
*H01L 21/762* (2006.01)

(52) U.S. Cl.
CPC .... *H01L 29/0649* (2013.01); *H01L 21/76224* (2013.01)

(58) Field of Classification Search
CPC ...................... H01L 21/76224; H01L 29/0649
USPC .......................................................... 257/506
See application file for complete search history.

(56) References Cited

U.S. PATENT DOCUMENTS

| 8,822,304 | B2 | 9/2014 | Wang |
| 9,070,744 | B2 | 6/2015 | Yan |
| 9,257,305 | B2 | 2/2016 | Lee |
| 9,865,453 | B2 | 1/2018 | Moon et al. |
| 2007/0072389 | A1* | 3/2007 | Cho .................. H01L 21/76232 438/427 |
| 2008/0122030 | A1* | 5/2008 | Cheng .................. H01L 29/945 257/532 |
| 2010/0041208 | A1 | 2/2010 | Baek |
| 2016/0056110 | A1 | 2/2016 | Kim et al. |
| 2017/0084452 | A1 | 3/2017 | Yang et al. |
| 2017/0256561 | A1 | 9/2017 | Lee |

* cited by examiner

*Primary Examiner* — Theresa T Doan
(74) *Attorney, Agent, or Firm* — Winston Hsu

(57) ABSTRACT

Provided is a shallow trench isolating structure and a semiconductor device. The trench isolating structure is formed in a substrate and includes a first and a second part. The first part has a first side wall extending from a surface of the substrate to a location, the first side wall has a first slope, and a surface of it has a first roughness. The second part has a second side wall extending from the first side wall to a location, the second side wall has a second slope, and a surface of it has a second roughness, the second slope is greater than the first slope, and the second roughness is greater than the first roughness. The disclosure solves the problem that it is difficult to fill the shallow trench isolating structure, and an undersized available space of the surface of the substrate may not be caused.

10 Claims, 3 Drawing Sheets

SHALLOW TRENCH ISOLATING STRUCTURE AND SEMICONDUCTOR DEVICE

TECHNICAL FIELD

The disclosure relates to the technical field of semiconductor manufacturing, and in particular to a shallow trench isolating structure and a semiconductor device including the shallow trench isolating structure.

BACKGROUND

Along rapid development of a semiconductor manufacturing technology, a size of a semiconductor device and an isolating structure thereof have been becoming smaller and smaller. It has become a conventional technology to isolate the semiconductor device with a shallow trench isolation (STI) technology.

FIG. 1a is a schematic diagram of a section shape of a conventional shallow trench isolating structure. As shown in FIG. 1a, a section of the shallow trench isolating structure is tapered generally, and a width thereof gets narrow along an increasing depth inside a substrate. In this way, a width of a bottom of the shallow trench isolating structure is very small. Thus, in a subsequent manufacturing process, filling of the shallow trench isolating structure may become very difficult. On the other hand, if the width of the bottom of the shallow trench isolating structure is set to be slightly greater, an opening of the shallow trench isolating structure on a surface of the substrate would be very large. In this way, an available space of the surface of the substrate may be undersized.

FIG. 1b is a schematic diagram of a section shape of another conventional shallow trench isolating structure. As shown in FIG. 1b, the section of the shallow trench isolating structure is rectangular generally, and a width thereof is unchanged basically along the increasing depth inside the substrate. In this way, if the opening of the shallow trench isolating structure on the surface of the substrate is small, the filling of the shallow groove isolation structure may become very difficult likewise. If the opening of the shallow trench isolating structure on the surface of the substrate is very large, the available space on the surface of the substrate may be undersized likewise.

Therefore, a novel shallow trench isolating structure is expected, which is, able to solve the problem that it is difficult to fill the shallow trench isolating structure and may not cause an undersized available space on the surface of the substrate.

SUMMARY

In view of this, the disclosure provides a novel shallow trench isolating structure, in this way filling of the shallow trench isolating structure may become easy, and no undersized available space on a surface of a substrate may be caused.

According to a first aspect of the disclosure, a shallow trench isolating structure is provided, which is formed in a substrate, herein, the shallow trench isolating structure may include a first part and a second part.

The first part has a first side wall extending from a surface of the substrate to a location with a first depth inside the substrate, the first side wall has a first slope relative to the surface of the substrate, and a surface of the first side wall has a first roughness.

The second part has a second side wall extending from the first side wall of the location with the first depth to a location with a second depth inside the substrate, the second depth is greater than the first depth, the second side wall has a second slope relative to the surface of the substrate, and a surface of the second side wall has a second roughness.

Herein, the second slope is greater than the first slope.

In addition, herein, the second roughness is greater than the first roughness.

In an embodiment, the first part has a width which gradually gets narrow from the surface of the substrate to the location with the first depth.

In an embodiment, a ripple extending in a depth direction of the substrate is formed on the surface of the second side wall.

In an embodiment, a number of the ripples is equal or greater than 3.

In an embodiment, the ripple begins to extend from the location with the first depth.

In an embodiment, the ripple begins to extend from a place which has a predetermined distance far away from the location with the first depth.

In an embodiment, a corrugated edge or a valley shape extending in the depth direction of the substrate is formed on the surface of the second side wall.

In an embodiment, the surface of the first side wall is smooth.

In an embodiment, the second depth is 2-10 times of the first depth.

In an embodiment, the shallow trench isolating structure may further include:

a third part, which has a third side wall extending from the second side wall of the location with the second depth to the surface of the substrate and converging at a point at a location with a third depth, in this way the third part forms a shape of a convex lens.

In an embodiment, the shallow trench isolating structure may further include:

a third part, which has a third side wall extending from the second side wall of the location with the second depth to a direction of the substrate opposite to the surface and converging at a point at the location with the third depth, in this way the third part forms a shape of a bullet.

According to another aspect of the disclosure, a semiconductor device is provided, including one or multiple above-mentioned shallow trench isolating structures.

Compared with the conventional art, each of the above-mentioned aspects of the disclosure may have the following advantages or beneficial effects.

An upper part of the shallow trench isolating structure according to the disclosure is tapered, in this way an opening of the shallow trench isolating structure is large, and accordingly it is easy to fill. A lower part of the shallow trench isolating structure according to the disclosure is approximately vertical, and the roughness of the surface of the side wall thereof is greater than that of the surface of the side wall of the upper part, in this way the shallow trench isolating structure is easy to fill likewise. In addition, the shallow trench isolating structure according to the disclosure gradually becomes large only at the opening of the upper part. Therefore, the problem that an available space of the surface of the substrate is undersized may not be caused. Therefore, the disclosure not only solves the problem that it is difficult to fill the shallow trench isolating structure, but may not cause the undersized available space of the surface of the substrate.

Other features and advantages of the disclosure will be elaborated in the subsequent description, and part of the other features and advantages of the disclosure will become apparent from the description, or known through implementation of the disclosure. A purpose and other advantages of the disclosure may be achieved and acquired through the description, claims and structures specially pointed out in drawings.

BRIEF DESCRIPTION OF THE DRAWINGS

The accompanying drawings described herein are used to provide a further understanding of the disclosure, constitute a part of the description, and are used to explain the disclosure jointly with embodiments of the disclosure, but do not constitute limitations to the disclosure.

In the drawings, identical parts use the same reference number, and the drawings are schematic and will not be drawn according to an actual scale.

DETAILED DESCRIPTION OF THE EMBODIMENTS

Figure 1A:
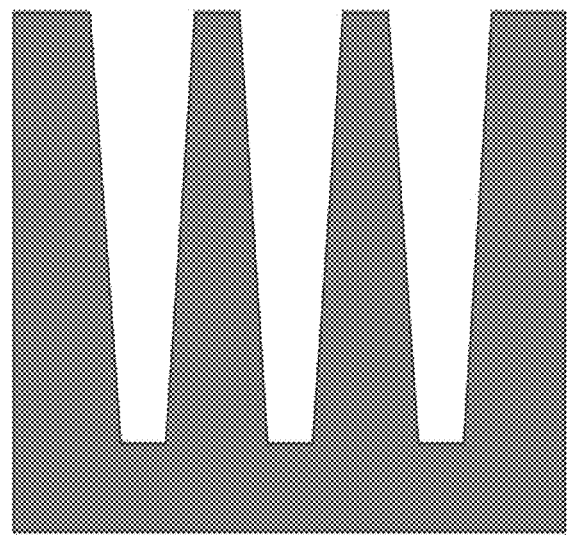
FIG. 1a is a schematic diagram of a section shape of a conventional shallow trench isolating structure.
Figure 1B:
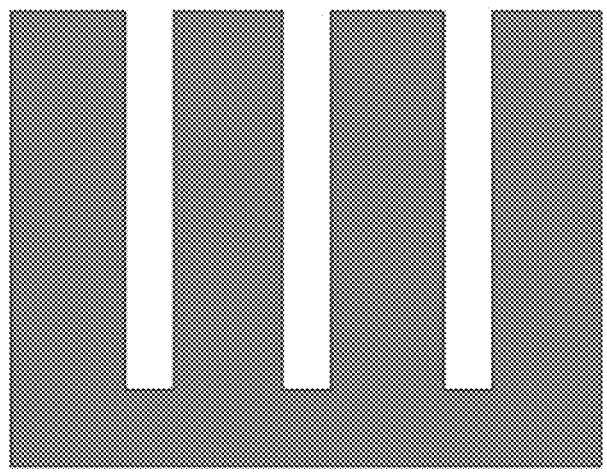
FIG. 1b is a schematic diagram of a section shape of another conventional shallow trench isolating structure.

The implementation modes of the disclosure will be elaborated below in combination with drawings and embodiments, to thereby completely understand an achievement process related to a way that the disclosure solves the technical problems by using the technical means and achieves the technical effect, and hereby implement the process. It is to be noted that all embodiments in the disclosure and features in the embodiments may be combined with each other without conflict, and the formed technical solutions should fall within the scope of protection of the disclosure.

Meanwhile, for explanation, many specific details are elaborated in the following description, as to provide a thorough understanding of the embodiments of the disclosure. However, it is apparent for those skilled in the art that the disclosure does not need to be implemented with specific details described herein or a described specified mode.

Many different embodiments or examples are publicly provided below, for implementation of different parts of the disclosure. Specific examples of elements and configurations are described below, as to simplify the disclosure. Of course, the above is merely example and not intended to limit. For example, formation of a first component "above" or "on" a second component in the following description may include an embodiment of forming the first component and the second component in a direct contact mode, and, as an alternative, may include an embodiment of forming an additional component between the first component and the second component, in this way the first component may not be in direct contact with the second component.

In addition, in order to facilitate description, spatial relative terms (for example, "under", "below", "lower part", "on", "above", "upper part" and the like) are used to describe a relationship between one element or one component shown in the drawing and another element or another component. Outside an orientation drawn in the drawings, these spatial relative terms aim at including different orientations of a used device or operation. For example, if the device in the drawing is reversed, the element described in "below" other elements or devices shall be oriented to be "above" the other elements or other components. Therefore, a typical term "below" may include two orientations: "above" and "below".

In order to solve the technical problem that it is difficult to fill an existing shallow trench isolating structure, the embodiment of the disclosure provides a novel shallow trench isolating structure and a semiconductor device including the shallow trench isolating structure.

Figure 2:
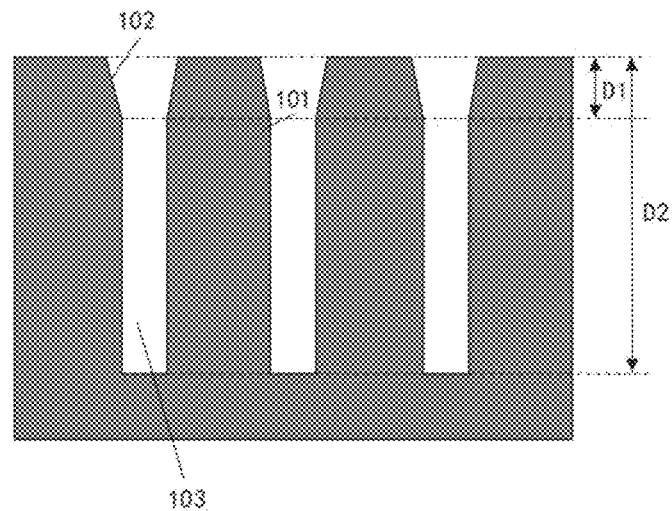
FIG. 2 is a schematic diagram of a section view of a shallow trench isolating structure according to an embodiment of the disclosure.

FIG. 2 is a schematic diagram of a section shape of a shallow trench isolating structure according to an embodiment of the disclosure. To be clear, FIG. 2 has been simplified to better understand a concept of the disclosed. An additional component may be added to the trench isolating structure as needed. The shallow trench isolating structure shown in FIG. 2 is formed inside a substrate 101. In the embodiment as shown, the trench isolating structure may include three trenches configured inside the substrate 101. The trench isolating structure may include less or more trenches according to a design requirement of a semiconductor device, for example, only one or many trenches.

The substrate 101 may include a semiconductor material, for example, a group-IV semiconductor, a group-III-V semiconductor or a group-II-VI oxide semiconductor. For example, the group-IV semiconductor may include silicon, germanium or silicon germanium. The substrate 101 may be a chip or an epitaxial wafer. Or, the substrate 101 may be a Silicon On Insulator (SOI) substrate, a gallium arsenide substrate, a silicon germanium substrate, a ceramic substrate, a quartz substrate or a glass substrate for a display. A unit device (not shown) for forming the semiconductor device, for example, various types of active devices or passive devices, may be formed on the substrate 101. The shallow trench isolating structure is configured to implement electric isolation between all unit devices.

In the described embodiment, the shallow trench isolating structure extends for a depth D inside the substrate from a surface of the substrate. The depth D is less than a thickness of the substrate. As further discussed below, the shallow trench isolating structure has sections of a first part 102 and a second part 103. In the embodiment as shown, the first part 102 is located above the second part 103.

The first part 102 has a first side wall, and the first side wall extends to a location with a first depth D1 inside the substrate from the surface of the substrate. The first side wall has a first slope relative to the surface of the substrate, and a surface of the first side wall has a first roughness.

The second part 103 has a second side wall, and the second side wall extends to a location with a second depth D2 inside the substrate from the first side wall of the location with the first depth D1. The second depth D2 is greater than the first depth D1. The second side wall has a second slope relative to the surface of the substrate, and a surface of the second side wall has a second roughness.

In the embodiment as shown, a width of the first part 102 gradually gets narrow from the surface of the substrate to the location with the depth D1, while a width of the second part 103 does not change greatly from the location with the first depth D1 to the location with the second depth D2. Therefore, the second slope is greater than the first slope. That is to say, an opening of an upper part of the shallow trench isolating structure is large, in this way it is easy to fill. A lower part of the shallow trench isolating structure is approximately vertical. In this way, compared with the shallow trench isolating structure (herein the opening gradually becomes large from a bottom) shown in FIG. 1a, the opening according to the shallow trench isolating structure of the disclosure gradually become large from edges of the upper part and the lower part only, and accordingly the opening of the surface of the substrate will not be relatively too large. Therefore, an undersized available space of the surface of the substrate may not be caused.

In an embodiment, the second depth D2 is 2-10 times of the first depth D1. Namely, the second part 103 is longer or much longer than the first part 102 in a depth direction.

In an embodiment, the surface of the first side wall of the first part 102 is approximately smooth, namely, the first roughness is very small. While the roughness of the surface of the second side wall of the second part 103 is relatively great, in this way it is easy to fill the shallow trench isolating structure.

Figure 3:
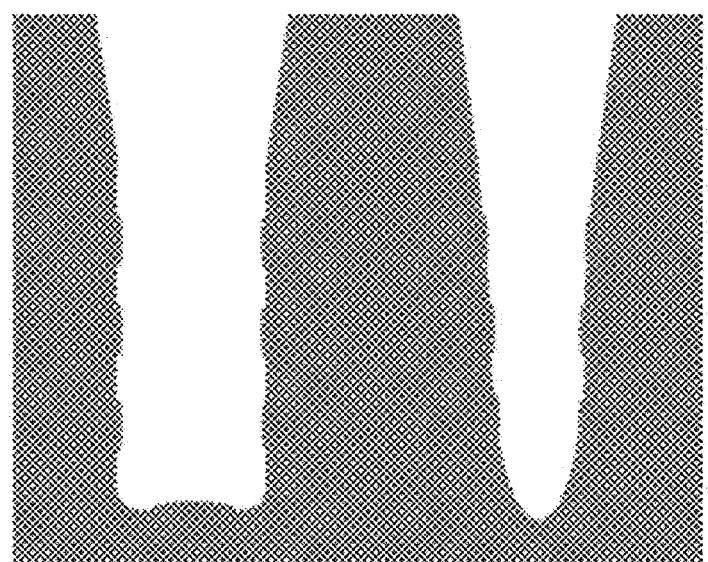
FIG. 3 is an enlarged view which schematically shows a side wall shape of a shallow trench isolating structure according to an embodiment of the disclosure.

In an embodiment, a ripple extending in a depth direction of the substrate is formed on the surface of the second side wall of the second part 103. Or, a corrugated edge extending in the depth direction of the substrate is formed on the surface of the second side wall of the second part 103. Or, a valley shape extending in the depth direction of the substrate is formed on the surface of the second side wall of the second part 103. FIG. 3 is an enlarged view which schematically shows a side wall shape of a shallow trench isolating structure according to an embodiment of the disclosure. The enlarged view shows the enlarged ripple, the enlarged corrugated edge or the enlarged valley shape on the surface of the second side wall of the second part 103.

In an embodiment, each number of the ripples, the corrugated edges or the valley shapes is greater than or equal to 3.

In an embodiment, the ripple, the corrugated edge or the valley shape may begin to extend from the location with the first depth D1. In another embodiment, the ripple, the corrugated edge or the valley shape may begin to extend from a place which has a predetermined distance far away from the location with the first depth D1. The predetermined distance may be set according to actual need.

In an embodiment, the shallow trench isolating structure may further include a third part, namely a bottom part below the second part 102. FIG. 3 further schematically shows a side wall shape of a bottom of a shallow trench isolating structure according to an embodiment of the disclosure.

In an embodiment, as shown by the shallow trench isolating structure on a left side in FIG. 3, the third part has a third side wall extending from the second side wall of the location with the second depth D2 to an upper surface of the substrate 101 and converging at a point at a location with a third depth, in this way the third part forms a shape similar to a convex lens. The third depth ranges between the first depth D1 and the second depth D2, and is a little bit less than the second depth D2 only. Namely, the third part extends slightly in the depth direction. The purpose is to avoid discharging at a sharp point and prevent the third part from becoming a leakage path.

In another embodiment, as shown by the shallow trench isolating structure on a right side in FIG. 3, the third part has the third side wall extending from the second side wall of the location with the second depth D2 to a lower surface of the substrate 101 and converging at a point at the location with the third depth, in this way the third part forms a shape similar to a bullet.

It is to be noted that the abovementioned shallow trench isolating structure according to the embodiment of the disclosure may be fabricated with an existing method or an existing etching process of the shallow trench isolating structure. The disclosure is to protect the section shape of the defined shallow trench isolating structure and not intended to limit the forming method or etching process to prepare the abovementioned shallow trench isolating structure in the embodiment of the disclosure. In addition, those skilled in the art should know how to achieve it according to the shallow trench isolating structure disclosed by the disclosure. But, no matter what method is taken, it should fall within the scope of protection of the disclosure as long as the shallow trench isolating structure according to the disclosure is acquired.

In order to facilitate understanding and explanation, a method of forming the shallow trench isolating structure according to the disclosure will be exemplarily described below.

Figure 4:
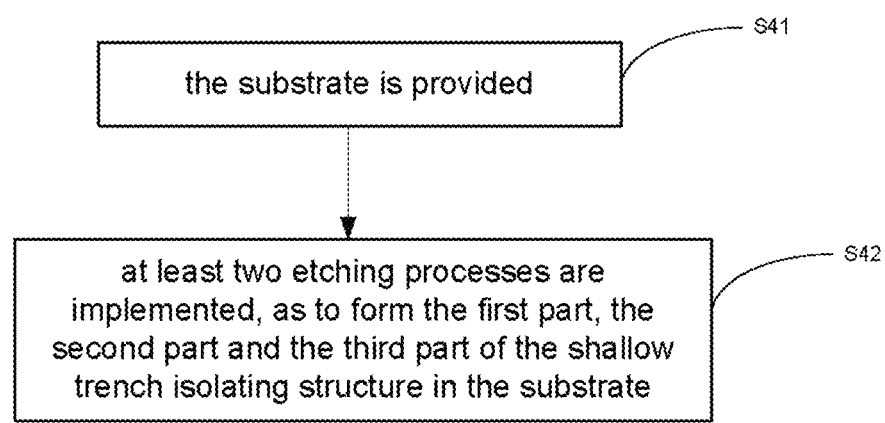
FIG. 4 is a flow diagram of a method of fabricating a shallow trench isolating structure according to an embodiment of the disclosure.

FIG. 4 is a flow diagram of a method of fabricating a shallow trench isolating structure according to an embodiment of the disclosure. The method may include the following steps.

At Step S41, the substrate is provided.

At Step S42, at least two etching processes are implemented, as to form the first part, the second part and the third part of the shallow trench isolating structure in the substrate.

A trench may be filled with a dielectric material. In the embodiment, the trench is filled with an oxidized material formed through High Density Plasma (HDP) deposition, High Aspect Ratio Process (HARP) deposition, and flowable Chemical Vapor Deposition (CVD), other appropriate depositions or a combination thereof. An additive step may be provided before, during and after the method, and a certain step may be substituted or deleted for an additional embodiment of the method.

The etching process may include dry etching, wet etching, other etching methods or a combination thereof, and it is known by those of ordinary skill in the art.

First, a first etching process is implemented, as to form the first part of the shallow trench isolating structure inside the substrate. The first etching process is controlled to achieve an expected section of the first part. More specifically, for example, polymer enriched gas is used during the first etching process, herein, the polymer enriched gas is adjusted to achieve the first part 102 of the section shown in FIG. 2, and the section gradually gets narrow along an increasing depth. In an embodiment, the first etching process is the dry etching process. The dry etching process has an adjustable etching parameter, for example, a used etching agent, an etching pressure, a voltage, radio frequency (RF) bias, RF bias power, a flow rate of the etching agent and other appropriate parameters.

In an embodiment, during the first etching process, a polymer layer is formed on the first side wall of the first part of the shallow trench isolating structure. The polymer layer shall prevent the section from being influenced by a subsequent etching process, herein the section of the first part of the shallow trench isolating structure becomes narrow.

Then, a second etching process is implemented, as to form the second part and the third part of the shallow trench isolating structure inside the substrate. The second etching process is controlled to achieve the expected sections of the second part and the third part. In an embodiment, etching is implemented by etching gas and taking a mask pattern as an etching mask. The etching gas may be $Cl_2$ or $F_2$. The etching gas may be excited with various types of plasmas, and may generate a reaction with the substrate. In this way, a pattern of the mask pattern may be transferred to the substrate, and accordingly the ripple, the corrugated edge or the valley shape extending in the depth direction of the substrate may be formed on the surface of the second side wall of the second part gradually.

Therefore, the shallow trench isolating structure according to the embodiment of the disclosure may be formed through the abovementioned steps.

According to another aspect of the disclosure, a semiconductor device is further provided, including one or multiple abovementioned shallow trench isolating structures, for electric isolation between all unit devices on a substrate of the semiconductor device.

It should be understood that the embodiments disclosed by the disclosure are not limited to the specific processing steps or materials disclosed herein, but should be extended to an equivalent substitution of these features understood by the those of ordinary skill in the art. It should also be understood that terms used herein are merely used to describe the purpose of the specific embodiments and do not mean to limit.

The "embodiment" mentioned in the description is defined as specific features described in combination with the embodiment, or that the feature is contained in at least one embodiment of the disclosure. Therefore, phrases or "embodiment" occurring in all places throughout the description does not necessarily mean the identical embodiment.

In addition, the features or characteristics described may be combined into one or more embodiments with any other appropriate mode. In the abovementioned description, some specific details are provide, for example, thickness, quantity and the like, as to provide a comprehensive understanding of the embodiment of the disclosure. However, those skilled in the art should understand that the disclosure may be achieved without one or more of the abovementioned specific details, as an alternative, may be achieved with other methods, assemblies, materials and the like.

Although the abovementioned examples are used to explain the principle of the disclosure in one or more applications, it is apparent for those skilled in the art to make various modifications in form, usage and details of implementation without creative work on the premise that the principle and thought of the disclosure are not deviated. Therefore, the disclosure is defined by appended claims.

What is claimed is:

1. A shallow trench isolating structure, which is formed in a substrate, wherein, the shallow trench isolating structure comprises:
    a first part, having a first side wall extending from a surface of the substrate to a location with a first depth inside the substrate, the first side wall having a first slope relative to the surface of the substrate, and a surface of the first side wall having a first roughness; and
    a second part, having a second side wall extending from the first side wall of the location with the first depth to a location with a second depth inside the substrate, the second depth being greater than the first depth, the second side wall having a second slope relative to the surface of the substrate, and a surface of the second side wall having a second roughness,
    wherein, the second slope is greater than the first slope,
    wherein, the second roughness is greater than the first roughness.
    and wherein, a ripple extending in a depth direction of the substrate is formed on the surface of the second side wall; or, a corrugated edge or a valley shape extending in the depth direction of the substrate is formed on the surface of the second side wall.

2. The shallow trench isolating structure as claimed in claim 1, wherein the first part has a width which gradually gets narrow from the surface of the substrate to the location with the first depth.

3. The shallow trench isolating structure as claimed in claim 1, wherein a number of the ripples is equal or greater than 3.

4. The shallow trench isolating structure as claimed in claim 1, wherein the ripple begins to extend from the location with the first depth.

5. The shallow trench isolating structure as claimed in claim 1, wherein the ripple begins to extend from a place which has a predetermined distance far away from the location with the first depth.

6. The shallow trench isolating structure as claimed in claim 1, wherein the surface of the first side wall is smooth.

7. The shallow trench isolating structure as claimed in claim 1, wherein the second depth is 2-10 times of the first depth.

8. The shallow trench isolating structure as claimed in claim 1, wherein the shallow trench isolating structure further comprises:
    a third part, having a third side wall extending from the second side wall of the location with the second depth to the surface of the substrate and converging at a point at a location with a third depth, in this way the third part forms a shape of a convex lens.

9. The shallow trench isolating structure as claimed in claim 1, wherein the shallow trench isolating structure further comprises:
    a third part, having a third side wall extending from the second side wall of the location with the second depth to a direction of the substrate opposite to the surface and converging at a point at the location with the third depth, in this way the third part forms a shape of a bullet.

10. A semiconductor device, comprising one or multiple shallow trench isolating structures as claimed in claim 1.

* * * * *